(12) United States Patent
Mihara

(10) Patent No.: US 6,735,119 B2
(45) Date of Patent: May 11, 2004

(54) NONVOLATILE SEMICONDUCTOR MEMORY

(75) Inventor: Masaaki Mihara, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/338,635

(22) Filed: Jan. 9, 2003

(65) Prior Publication Data

US 2004/0012997 A1 Jan. 22, 2004

(30) Foreign Application Priority Data

Jul. 18, 2002 (JP) ........................................ 2002-209808

(51) Int. Cl.[7] .............................................. G11C 16/04
(52) U.S. Cl. .................... 365/185.18; 365/185.2
(58) Field of Search ..................... 365/185.18, 185.2, 365/185.23, 185.24

(56) References Cited

U.S. PATENT DOCUMENTS

| | | | |
|---|---|---|---|
| 4,797,856 A | * | 1/1989 | Lee et al. ................. 365/185.3 |
| 5,748,534 A | | 5/1998 | Dunlap et al. |
| 5,801,993 A | | 9/1998 | Choi |
| 5,892,714 A | | 4/1999 | Choi |
| 5,973,959 A | | 10/1999 | Gerna et al. |
| 6,016,272 A | | 1/2000 | Gerna et al. |
| 6,091,642 A | | 7/2000 | Pasotti et al. |
| 6,094,374 A | | 7/2000 | Sudo |
| 6,097,639 A | | 8/2000 | Choi et al. |
| 6,111,791 A | * | 8/2000 | Ghilardelli ............. 365/185.28 |
| 6,269,022 B1 | | 7/2001 | Ra |

FOREIGN PATENT DOCUMENTS

| | | |
|---|---|---|
| JP | 11-126487 | 5/1999 |
| JP | 2001-15716 | 1/2001 |
| JP | 2001-357686 | 12/2001 |

* cited by examiner

*Primary Examiner*—Vu A. Le
(74) *Attorney, Agent, or Firm*—McDermott, Will & Emery

(57) ABSTRACT

In a nonvolatile semiconductor memory provided with a plurality of memory elements each having a control gate and a floating gate, an electric current detecting circuit detects a drain current supplied to a drain of each of the memory elements and a voltage control circuit controls, in accordance with the drain current detected by the electric current detecting circuit, a control gate voltage supplied to the control gate of each of the memory elements.

18 Claims, 8 Drawing Sheets

NONVOLATILE SEMICONDUCTOR MEMORY

BACKGROUND OF THE INVENTION

1. Field of the Invention

The present invention generally relates to nonvolatile semiconductor memories and more particularly, to a circuit configuration of data write and data erase in a nonvolatile semiconductor memory.

2. Description of the Prior Art

FIG. 10 shows a memory cell circuit of a conventional electrically erasable programmable read-only memory (EEPROM). The conventional memory cell circuit includes memory cells 221 to 223 and a peripheral circuit of the memory cells 221 to 223. The peripheral circuit includes a word line 224, a source line 225, a power line 226, bit lines 227 to 229, bit line drivers 230 to 232, data latch circuits 233 to 235, a word line driver 236 and a data line 237. In FIG. 10, each of the memory cells 221 to 223 is constituted by a metal-oxide-semiconductor (MOS) transistor in which a floating gate FG is formed on a channel connecting a source and a drain and a control gate CG for controlling potential of the channel is formed on the floating gate FG.

The word line 224 is connected to the control gates CG of the memory cells 221 to 223 and potential of the word line 224 is changed by the word line driver 236. The source line 225 is connected to the sources of the memory cells 221 to 223 and a distal end of the source line 225 is grounded. The bit lines 227 to 229 are, respectively, connected to the drains of the memory cells 221 to 223 such that the memory cells 221 to 223 exchange data with the peripheral circuit via the bit lines 227 to 229. By using a high voltage Vpp supplied through the power line 226, the bit line drivers 230 to 232 apply to the bit lines 227 to 229 outputs corresponding to data of the data latch circuits 233 to 235, respectively. The data line 237 is provided for exchanging data with an external device and connects the data latch circuits 233 to 235 to a data input/output port (not shown) for the external device.

In the conventional EEPROM of FIG. 10, when data is written is one of the memory cells 221 to 223, for example, the data cell 221, the data is initially latched from the data input/output port to all the data latch circuits 233 to 235 by way of the data line 237. Then, potential of the bit line 227 connected to the memory cell 221 for data write is raised by the bit line driver 230 and potential of the word line 224 is raised by the word line driver 236. In the meantime, since potential of the source line 225 is maintained at a ground level, a high voltage is applied between the source and the drain of the memory cell 221, so that hot electrons are generated at the channel by the high electric field. The hot electrons are attracted by the high potential of the floating gate FG of the memory cell 221 so as to be injected into the floating gate FG of the memory cell 221 and thus, a gate voltage threshold value at which electric current starts flowing between the source and the drain of the memory cell rises. When the gate voltage threshold value of the memory cell 221 has reached a desired value, the potential of the word line 224 and the potential of the bit line 227 connected to the memory cell 221 for data write are lowered and thus, data write is completed.

In the above described data write operation of the conventional EEPROM, since an initial period required for data latch is far shorter than a latter period required for raising the gate voltage threshold value of the memory cell to the desired value by generating the hot electrons, the data is simultaneously written in as many memory cells as possible by using such a circuit as shown in FIG. 10 such that write time per unit data quantity is reduced, thereby resulting in improvement of its operating efficiency.

However, in the above conventional EEPROM, as the number of the memory cells for simultaneous data write increases, electric current flowing through the memory cells increases immediately after start of data write and a current peak occurs. Therefore, current carrying capacity of the source line 225 and the power line 226 should be designed to be large in conformity with the current peak. Furthermore, in case the high voltage Vpp supplied to the bit lines 227 to 229 is generated internally, boosting capability of a booster should also be designed to be large in conformity with the current peak. As a result, such a problem arises that these design conditions run counter to recent industrial trends towards miniaturization and lower supply voltage.

Thus, in order to lower the current peak necessary for data write, Japanese Patent Laid-Open Publication No. 2001-15716 (2001) proposes a semiconductor memory unit in which a constant-current element 240 for restricting to a predetermined value a drain current supplied to the drains of the memory cells 221 to 223 is inserted between a power source of the high voltage Vpp and the power line 226 in the conventional EEPROM of FIG. 10 as shown in FIG. 11. However, the drain current supplied to the drains of the memory cells 221 to 223 varies due to scatter of characteristics of the memory cells 221 to 223, etc. Therefore, in this known semiconductor memory unit, such inconveniences are incurred that in case the predetermined value of the drain current restricted by the constant-current element 240 is not optimal, the current peak required for data write cannot be lowered and a generation efficiency of the hot electrons cannot be increased.

In addition, Japanese Patent Laid-Open Publication No. 11-126487 (1999) discloses a nonvolatile semiconductor memory in which a drain voltage supplied for data write to drains of memory cells is changed in accordance with a drain current supplied to the drains of the memory cells such that not only accurate control of a threshold voltage of the memory cells is performed at high speed but deterioration of the memory cells is prevented. However, in this prior art nonvolatile semiconductor memory, the drain voltage is changed in accordance with the drain current. On the other hand, in the nonvolatile semiconductor memory of the present invention, a control gate voltage supplied to control gates of memory cells is changed in accordance with the drain current. In this respect, the prior art nonvolatile semiconductor memory is different from the nonvolatile semiconductor memory of the present invention.

SUMMARY OF THE INVENTION

Accordingly, an essential object of the present invention is to provide, with a view to eliminating the above mentioned drawbacks of prior art, a nonvolatile semiconductor memory in which write time can be shortened by not only lowering a current peak required for data write but raising a generation efficiency of hot electrons.

In order to accomplish this object of the present invention, a nonvolatile semiconductor memory according to the present invention is provided with a plurality of memory elements each having a control gate and a floating gate such that data is stored by electron injection to the floating gate and electron emission from the floating gate. The nonvolatile semiconductor memory includes an electric current detecting circuit for detecting a drain current supplied to a drain of each of the memory elements. In accordance with the drain current detected by the electric current detecting circuit, a voltage control circuit controls a control gate voltage supplied to the control gate of each of the memory elements.

BRIEF DESCRIPTION OF THE DRAWINGS

This object and features of the present invention will become apparent from the following description taken in conjunction with the preferred embodiments thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Hereinafter, embodiments of the present invention are described with reference to the drawings.
(First Embodiment)

Figure 1:
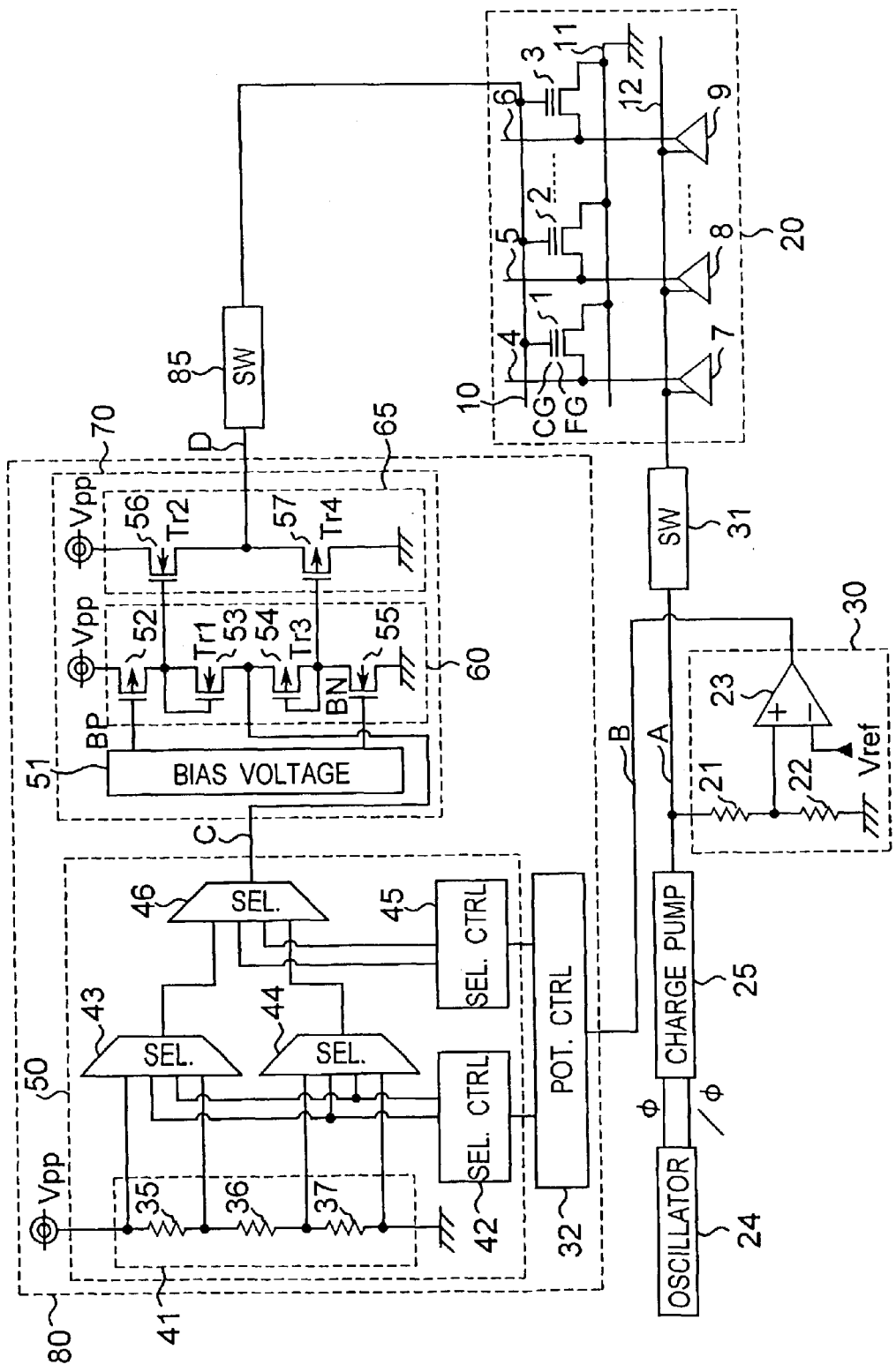
FIG. 1 is a circuit diagram of a nonvolatile semiconductor memory according to a first embodiment of the present invention.

FIG. 1 is a circuit diagram of a nonvolatile semiconductor memory according to a first embodiment of the present invention. This nonvolatile semiconductor memory includes a memory cell circuit 20 having a plurality of, for example, three memory cells 1 to 3 and a peripheral circuit of the memory cells 1 to 3. Each of the memory cells 1 to 3 is constituted by a metal-oxide-semiconductor (MOS) transistor in which a floating gate FG is formed on a channel connecting a source and a drain and a control gate CG for controlling potential of the channel is formed on the floating gate FG such that data is stored in the memory cells 1 to 3 upon injection of electrons into the floating gate FG and emission of electrons from the floating gate FG.

In the memory cell circuit 20, the peripheral circuit includes bit lines 4 to 6 connected to drains of the memory cells 1 to 3, respectively, bit line drivers 7 to 9 connected to the bit lines 4 to 6, respectively, a word line 10 connected to the respective control gates CG of the memory cells 1 to 3, a source line 11 connected to the respective sources of the memory cells 1 to 3 and a power line 12 connected to the bit line drivers 7 to 9.

The nonvolatile semiconductor memory further includes a first oscillator 24, a first charge pump circuit 25, a detection circuit 30 for detecting an output voltage of the first charge pump circuit 25, a first switching circuit 31 connected to the power line 12 of the memory cell circuit 20, a voltage control circuit 80 in which a control gate voltage supplied to the control gates CG of the memory cells 1 to 3 is controlled in accordance with the output voltage of the first charge pump circuit 25 detected by the detection circuit 30 and a second switching circuit 85 connected to the word line 10 of the memory cell circuit 20.

The first charge pump circuit 25 generates a high voltage in response to clock pulses φ and /φ outputted from the first oscillator 24 and supplies electric current to the drains of the memory cells 1 to 3 via the first switching circuit 31. The detection circuit 30 detects the output voltage of the first charge pump circuit 25 and includes resistance elements 21 and 22 and a comparator 23.

The voltage control circuit 80 includes a reference potential level control circuit 32, a reference potential generating circuit 50 for outputting a reference potential and an amplifier circuit 70 which receives the reference potential from the reference potential generating circuit 50 so as to output a drive potential equal to the reference potential. The reference potential generating circuit 50 includes a voltage divider 41 having resistance elements 35 to 37 connected to each other in series between a power source of a high voltage Vpp and ground, selector control circuits 42 and 45 connected to the reference potential level control circuit 32, selectors 43 and 44 for switching an output of the voltage divider 41 in accordance with a control signal of the selector control circuit 42 and a selector 46 for switching outputs of the selectors 43 and 44 in accordance with a control signal of the selector control circuit 45.

Meanwhile, the amplifier circuit 70 includes a bias voltage generating circuit 51 for outputting bias voltages BP and BN, a reference potential input portion 60 for receiving the reference potential from the reference potential generating circuit 50 and a drive portion 65 for outputting a drive potential in response to an output of the reference potential input portion 60. The reference potential input portion 60 includes a p-channel MOS transistor 52 which receives the bias voltage BP at its gate and has a node of the high voltage Vpp, an n-channel MOS transistor 55 which receives the bias voltage BN at its gate and has a grounded node, an n-channel MOS transistor 53 and a p-channel MOS transistor 54. The reference potential of the reference potential generating circuit 50 is applied to sources of the n-channel MOS transistor 53 and the p-channel MOS transistor 54.

The drive portion 65 includes an n-channel MOS transistor 56 and a p-channel MOS transistor 57. A gate of the n-channel MOS transistor 56 is connected to a gate of the n-channel MOS transistor 53 and a drain of the n-channel MOS transistor 56 is connected to the high voltage Vpp. A gate of the p-channel MOS transistor 57 is connected to a gate of the p-channel MOS transistor 54 and a drain of the p-channel MOS transistor 57 is grounded. The drive potential is outputted from a junction of a source of the n-channel MOS transistor 56 and a source of the p-channel MOS transistor 57 to the control gates CG of the memory cells 1 to 3 by way of the second switching circuit 85.

In the nonvolatile semiconductor memory of the above described configuration, if a drain current supplied to the drains of the memory cells 1 to 3 increases, the output voltage of the first charge pump circuit 25 drops accordingly. Namely, increase of the drain current supplied to the drains of the memory cells 1 to 3 appears as drop of voltage at a supply node A between the first charge pump circuit 25 and the first switching circuit 31. Thus, the drain current supplied to the drains of the memory cells 1 to 3 has a corresponding relation with the output voltage of the first charge pump circuit 25. Therefore, by converting increase of the drain current into drop of voltage of the supply node A, the detection circuit 30 detects the output voltage of the first charge pump circuit 25.

As described above, the drain current supplied to the drains of the memory cells 1 to 3 has the corresponding relation with the output voltage of the first charge pump circuit 25. Therefore, the detection circuit 30 for detecting the output voltage of the first charge pump circuit 25 is capable of detecting the drain current. As a result, the voltage control circuit 80 for controlling the control gate voltage in accordance with the output voltage of the first charge pump circuit 25 detected by the detection circuit 30 controls the control gate voltage in accordance with the drain current detected by the detection circuit 30.

The comparator 23 compares a reference voltage Vref with a potential obtained by dividing the voltage of the supply node A by the resistance elements 21 and 22. If the above potential is larger than the reference voltage Vref, the comparator 23 outputs a high-level detection signal to a node B. On the contrary, if the above potential is smaller than the reference voltage Vref, the comparator 23 outputs a low-level detection signal to the node B. Therefore, the detection signal of the detection circuit 30 is binary. This detection signal of the detection circuit 30 is inputted to the reference potential level control circuit 32. The nonvolatile semiconductor memory further has a node C between the reference potential generating circuit 50 and the amplifier circuit 70 and a node D between the amplifier circuit 70 and the second switching circuit 85.

If the drain current supplied to the drains of the memory cells 1 to 3 increases, the voltage of the supply node A drops and thus, the node B is at low level. In response to the low-level node B, the reference potential generating circuit 50 lowers potential of the node C. The potential of the node C is transmitted to the node D through the amplifier circuit 70 and is further transmitted to the control gates CG of the memory cells 1 to 3 via the second switching circuit 85 so as to lower potential of the control gates CG of the memory cells 1 to 3. As a result, the drain current supplied to the drains of the memory cells 1 to 3 is restrained.

On the contrary, if the drain current supplied to the drains of the memory cells 1 to 3 decreases, the voltage of the supply node A rises and thus, the node B is at high level. In response to the high-level node B, the reference potential generating circuit 50 raises the potential of the node C. The potential of the node C is transmitted to the node D via the amplifier circuit 70 and is further transmitted to the control gates CG of the memory cells 1 to 3 through the second switching circuit 85 so as to raise the potential of the control gates CG of the memory cells 1 to 3. As a result, the drain current supplied to the drains of the memory cells 1 to 3 is increased.

Figure 2:
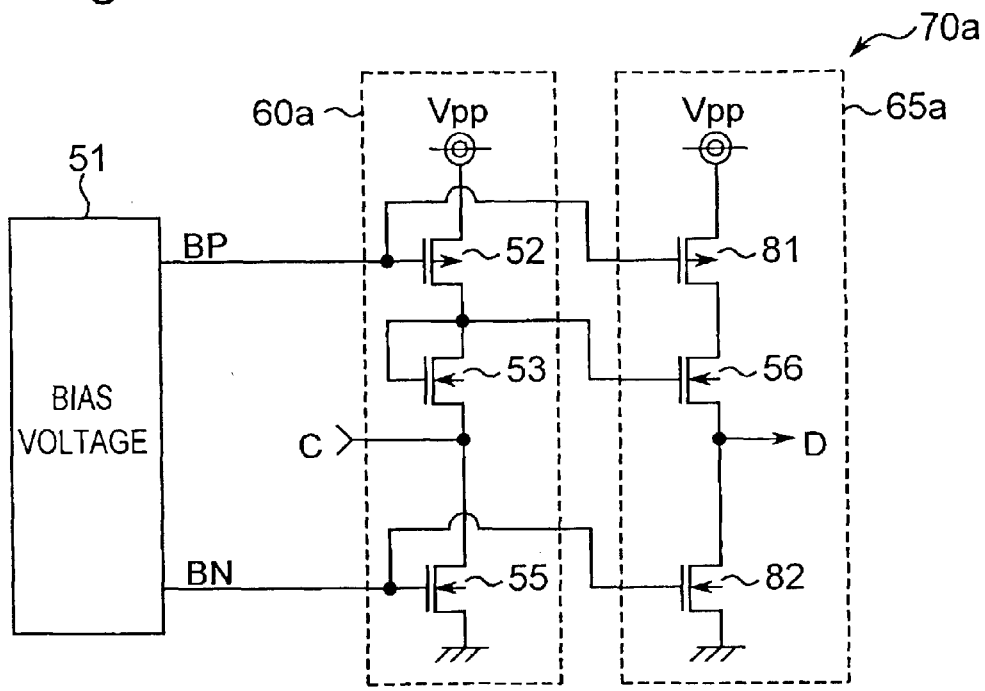
FIG. 2 is a circuit diagram of an amplifier circuit employed in a nonvolatile semiconductor memory which is a first modification of the nonvolatile semiconductor memory of FIG. 1.

In the nonvolatile semiconductor memory of the present invention, the amplifier circuit 70 can be modified variously. FIG. 2 shows an amplifier circuit 70a employed in a nonvolatile semiconductor memory which is a first modification of the nonvolatile semiconductor memory of FIG. 1. The amplifier circuit 70a includes the bias voltage generating circuit 51, a reference potential input portion 60a and a drive portion 65a. In the amplifier circuit 70a, the p-channel MOS transistors 54 and 57 of the amplifier circuit 70 are eliminated. Meanwhile, the drive portion 65a includes a p-channel MOS transistor 81 having a gate connected to a gate of the p-channel MOS transistor 52 and an n-channel MOS transistor 82 having a gate connected to a gate of the n-channel MOS transistor 55.

Figure 3:
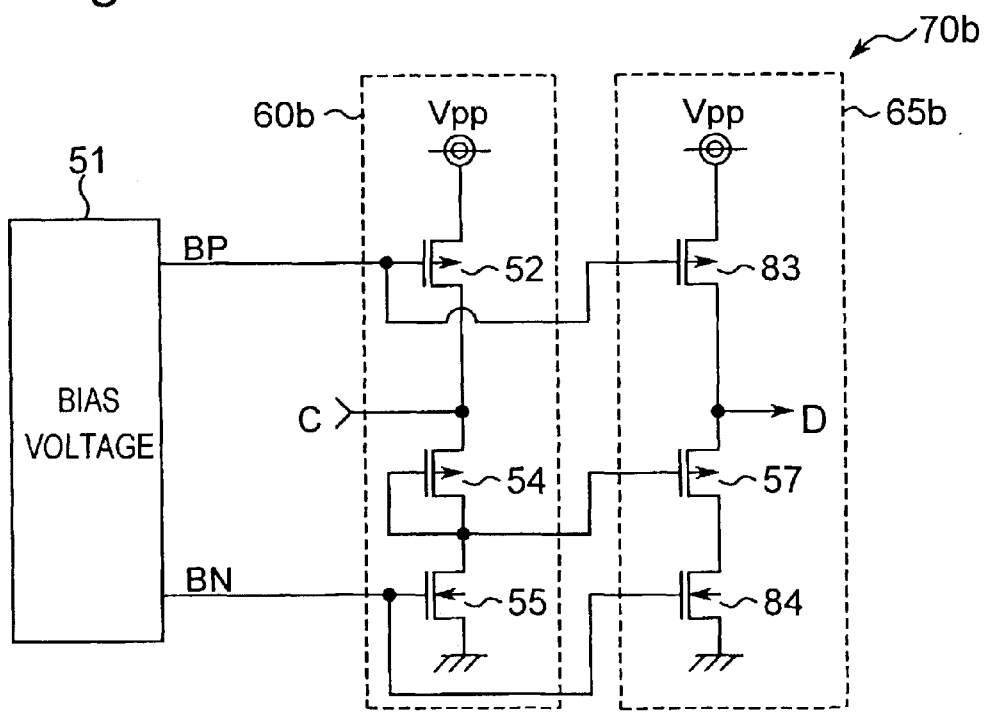
FIG. 3 is a circuit diagram of an amplifier circuit employed in a nonvolatile semiconductor memory which is a second modification of the nonvolatile semiconductor memory of FIG. 1.

FIG. 3 shows an amplifier circuit 70b employed in a nonvolatile semiconductor memory which is a second modification of the nonvolatile semiconductor memory of FIG. 1. The amplifier circuit 70b includes the bias voltage generating circuit 51, a reference potential input portion 60b and a drive portion 65b. In the amplifier circuit 70b, the n-channel MOS transistors 53 and 56 of the amplifier circuit 70 are eliminated. Meanwhile, the drive portion 65b includes a p-channel MOS transistor 83 having a gate connected to the gate of the p-channel MOS transistor 52 and an n-channel MOS transistor 84 having a gate connected to the gate of the n-channel MOS transistor 55.

Figure 4:
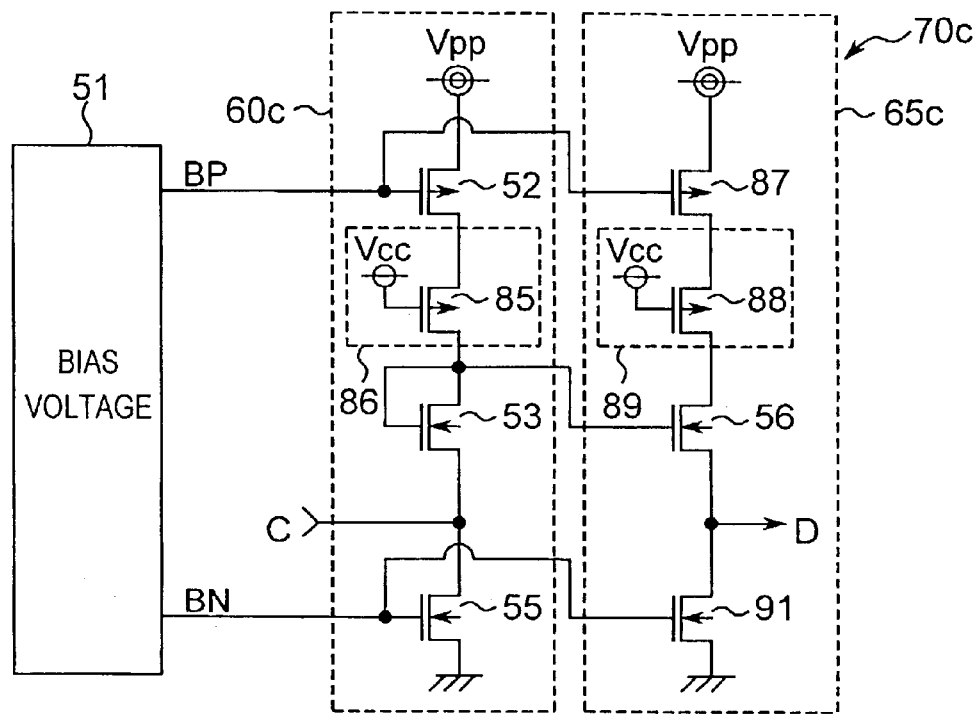
FIG. 4 is a circuit diagram of an amplifier circuit employed in a nonvolatile semiconductor memory which is a third modification of the nonvolatile semiconductor memory of FIG. 1.

FIG. 4 shows an amplifier circuit 70c employed in a nonvolatile semiconductor memory which is a third modification of the nonvolatile semiconductor memory of FIG. 1. The amplifier circuit 70c includes the bias voltage generating circuit 51, a reference potential input portion 60c and a drive portion 65c. In the amplifier circuit 70c, the p-channel MOS transistors 54 and 57 of the amplifier circuit 70 are eliminated. Meanwhile, in the reference potential input portion 60c, a p-channel MOS transistor 85 having a gate for receiving a supply voltage Vcc is inserted between the p-channel MOS transistor 52 and the n-channel MOS transistor 53 and acts as a current limiter 86 for restricting to a predetermined value electric current flowing through the n-channel MOS transistor 53. The drive portion 65c includes a p-channel MOS transistor 87 having a gate connected to the gate of the p-channel MOS transistor 52 and an n-channel MOS transistor 91 having a gate connected to the gate of the n-channel MOS transistor 55. Furthermore, a p-channel MOS transistor 88 having a gate for receiving the supply voltage Vcc is inserted between the p-channel MOS transistor 87 and the n-channel MOS transistor 56 and acts as a current limiter 89 for restricting to a predetermined value electric current flowing through the n-channel MOS transistor 56.

Figure 5:
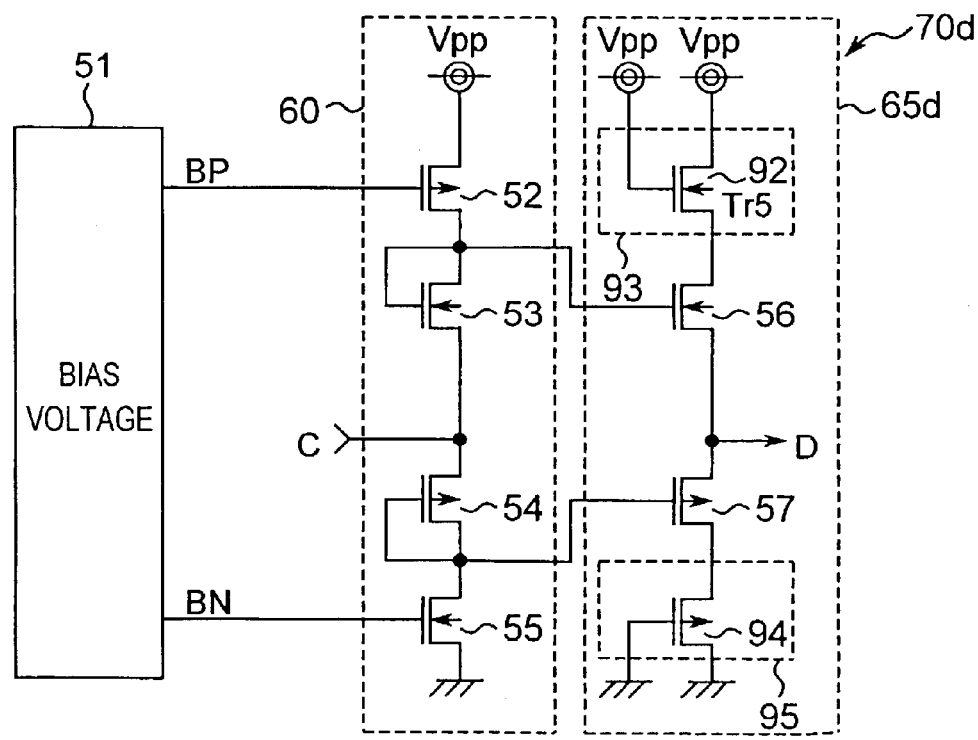
FIG. 5 is a circuit diagram of an amplifier circuit employed in a nonvolatile semiconductor memory which is a fourth modification of the nonvolatile semiconductor memory of FIG. 1.

FIG. 5 shows an amplifier circuit 70d employed in a nonvolatile semiconductor memory which is a fourth modification of the nonvolatile semiconductor memory of FIG. 1. The amplifier circuit 70d includes the bias voltage generating circuit 51, the reference potential input portion 60 and a drive portion 65d. The drive portion 65d includes an n-channel MOS transistor 92 in which the high voltage Vpp is applied to a gate and a drain so as to build up a diode connection and a p-channel MOS transistor 94 in which a gate and a drain are grounded so as to build up a diode connection. The n-channel MOS transistor 92 acts as a voltage alleviating means 93 for alleviating a high voltage applied to the n-channel MOS transistor 56, while the p-channel MOS transistor 94 acts as a voltage alleviating means 95 for alleviating a high voltage applied to the p-channel MOS transistor 57.

In this embodiment, since the current peak required for data write can be lowered and the generation efficiency of hot electrons can be increased, write time can be shortened.

(Second embodiment)

Figure 6:
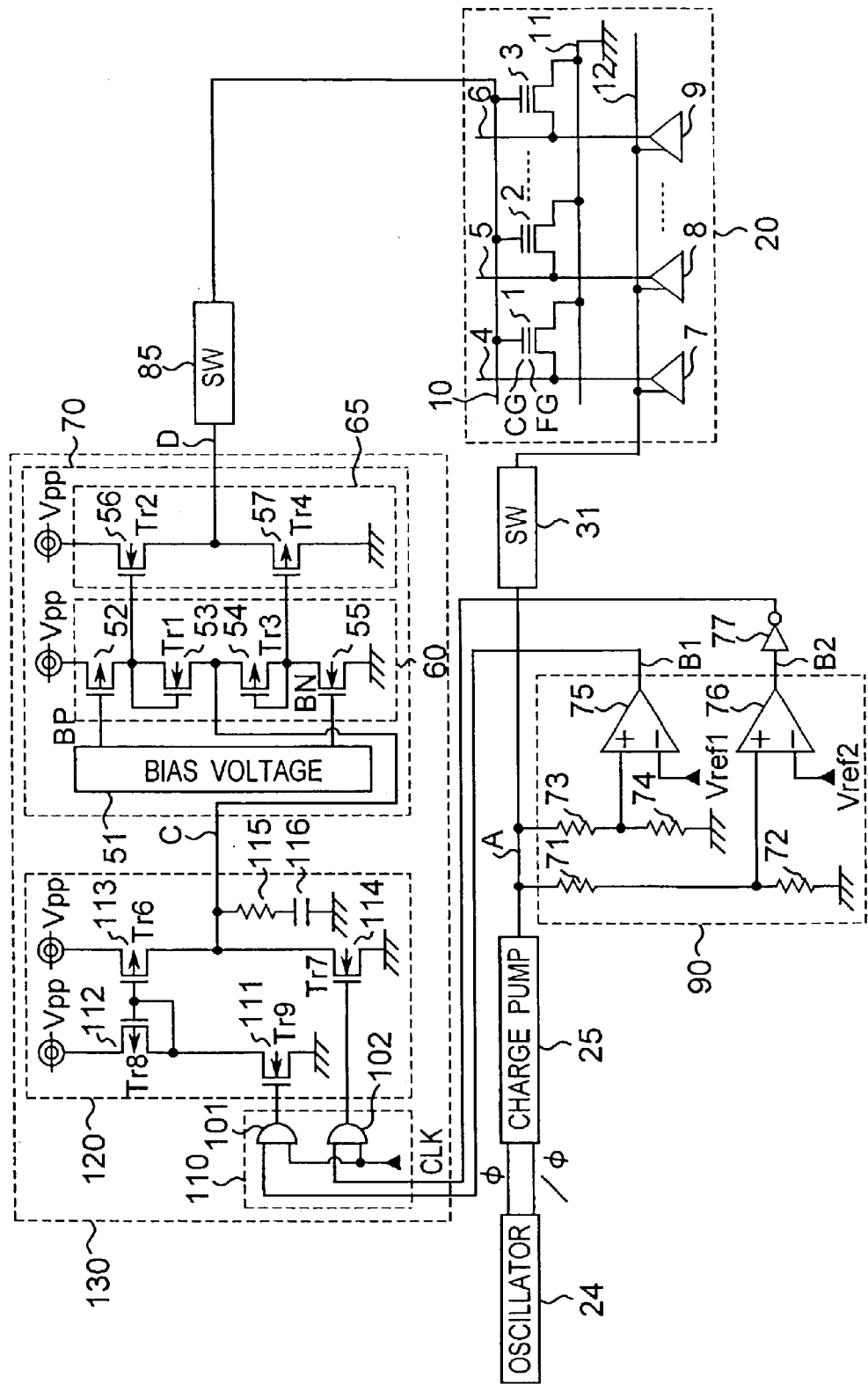
FIG. 6 is a circuit diagram of a nonvolatile semiconductor memory according to a second embodiment of the present invention.

FIG. 6 is a circuit diagram of a nonvolatile semiconductor memory according to a second embodiment of the present invention. This nonvolatile semiconductor memory includes a detection circuit 90 and a voltage control circuit 130. The detection circuit 90 includes resistance elements 71 to 74 and comparators 75 and 76, while the voltage control circuit 130 includes a reference potential level control circuit 110 and a reference potential generating circuit 120. The reference potential level control circuit 110 includes an AND circuit 101 for receiving a detection signal of the comparator 75 and an AND circuit 102 for receiving a detection signal of the comparator 76 via an inverter 77. The AND circuits 101 and 102 also receive a monitoring clock CLK.

The reference potential generating circuit 120 includes an n-channel MOS transistor 111, p-channel MOS transistors 112 and 113, an n-channel MOS transistor 114, a resistance element 115 and a capacitor 116. The n-channel MOS transistor 111 has not only a gate for receiving an output signal of the AND circuit 101 but a grounded node. The p-channel MOS transistors 112 and 113 have nodes of the high voltage Vpp and form current mirror circuits. The n-channel MOS transistor 114 has not only a gate for receiving an output signal of the AND circuit 102 but a grounded node. The resistance element 115 and the capacitor 116 are connected to each other in series between the node C and ground. Since other configurations of the nonvolatile semiconductor memory are similar to those of the nonvolatile semiconductor memory of the first embodiment of FIG. 1, the description is abbreviated for the sake of brevity.

In the same manner as the first embodiment, the drain current supplied to the drains of the memory cells 1 to 3 has the corresponding relation with the output voltage of the first charge pump circuit 25. Hence, by converting increase of the drain current into drop of the voltage of the supply node A, the detection circuit 90 detects the output voltage of the first charge pump circuit 25.

The detection circuit 90 operates as follows. Namely, the comparator 75 compares a reference voltage Vref1 with a potential obtained by dividing the voltage of the supply node A by the resistance elements 73 and 74. If the above potential is larger than the reference voltage Vref1, the comparator 75 outputs a high-level detection signal to a node B1. On the other hand, if the above potential is smaller than the reference voltage Vref1, the comparator 75 outputs a low-level detection signal to the node B1. Similarly, the comparator 76 compares a reference voltage Vref2 (Vref2>Vref1) with a potential obtained by dividing the voltage of the supply node A by the resistance elements 71 and 72. In case the above potential is larger than the reference voltage Vref2, the comparator 76 outputs a high-level detection signal to a node B2. On the other hand, in case the above potential is smaller than the reference voltage Vref2, the comparator 76 outputs a low-level detection signal to the node B2. Therefore, the detection signal of the detection circuit 90 is quaternary, i.e., four-valued.

Namely, supposing that character "P" denotes a potential of the node A, both of the nodes B1 and B2 are at high level when a relation of (P>Vref2) is satisfied. When a relation of (Vref2≧P≧Vref1) is satisfied, the node B1 is at high level and the node B2 is at low level. Meanwhile, when a relation of (Vref1>P) is satisfied, both of the nodes B1 and B2 are at low level.

Each time the monitoring clock CLK is at high level, a logical level of the node B1 is inputted to the gate of the n-channel MOS transistor 111 and a logical level of the node B2 is inputted to the gate of the n-channel MOS transistor 114. When the node B1 is at high level, the gate of the n-channel MOS transistor 111 is at high level, so that electric current flowing through the n-channel MOS transistor 111 is caused to flow into the node C by way of the current mirror circuits formed by the p-channel MOS transistors 112 and 113 so as to raise voltage of the node C.

On the other hand, when the node B2 is at high level, the gate of the n-channel MOS transistor 114 is at high level, so that electric current flowing through the n-channel MOS transistor 114 lowers the voltage of the node C. Namely, the voltage of the node C is adjusted in accordance with electric current flowing through the p-channel MOS transistor 113 and the n-channel MOS transistor 114 on the basis of the detection signal of the detection circuit 90.

In this embodiment, since the current peak required for data write can be lowered and the generation efficiency of hot electrons can be increased, write time can be shortened.

(Third Embodiment)

Figure 7:
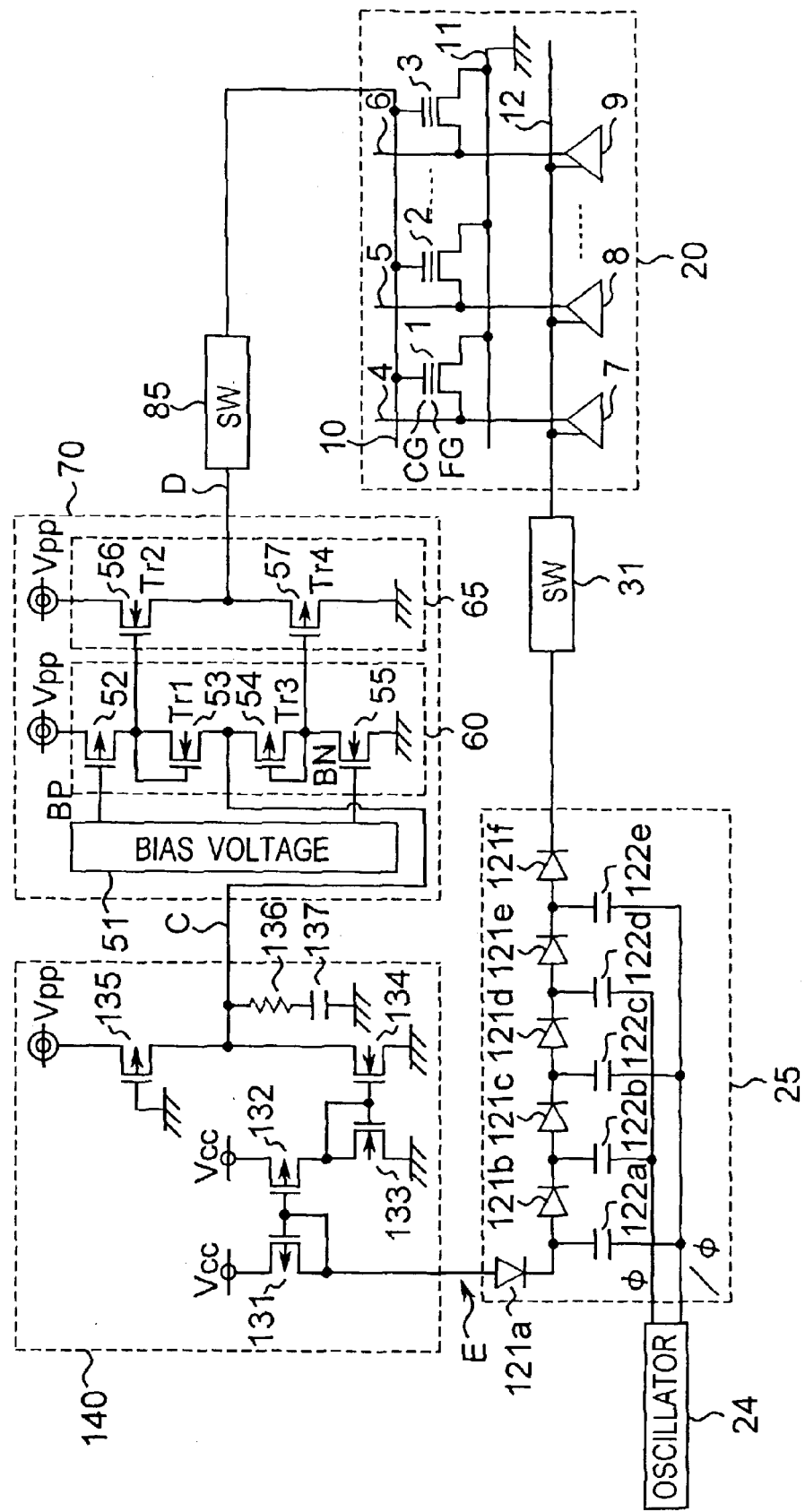
FIG. 7 is a circuit diagram of a nonvolatile semiconductor memory according to a third embodiment of the present invention.

FIG. 7 is a circuit diagram of a nonvolatile semiconductor memory according to a third embodiment of the present invention. This nonvolatile semiconductor memory includes a conversion circuit 140 provided between the first charge pump circuit 25 and the amplifier circuit 70. Thus, in this nonvolatile semiconductor memory, a combination of the conversion circuit 140 and the amplifier circuit 70 acts as a combination of the detection circuit 30 and the voltage control circuit 80 of the nonvolatile semiconductor memory of FIG. 1.

The first charge pump circuit 25 includes diodes 121a to 121f and capacitors 122a to 122e. Meanwhile, the conversion circuit 140 includes p-channel MOS transistors 131 and 132, n-channel MOS transistors 133 and 134, a p-channel MOS transistor 135 having a node of the high voltage Vpp and a grounded gate, a resistance element 136 and a capacitor 137. The p-channel MOS transistors 131 and 132 have nodes of the supply voltage Vcc and form current mirror circuits. The n-channel MOS transistors 133 and 134 have grounded nodes and form current mirror circuits. The resistance element 136 and the capacitor 137 are connected to each other in series between the node C and ground. Since other configurations of the nonvolatile semiconductor memory are similar to those of the nonvolatile semiconductor memory of the first embodiment of FIG. 1, the description is abbreviated for the sake of brevity.

An electric current supplied to the drains of the memory cells 1 to 3 by the first charge pump circuit 25 is proportional to an electric current flowing through a node E. The conversion circuit 140 outputs to the node C a voltage corresponding to the electric current flowing through the node E. Hence, the electric current supplied to the drains of the memory cells 1 to 3 has a corresponding relation with the voltage outputted to the node C by the conversion circuit 140.

Operation of the conversion circuit 140 is described below. The current mirror circuits are formed by the p-channel MOS transistors 131 and 132. Thus, an electric current in a quantity equal to that of an electric current flowing through the p-channel MOS transistor 131 flows through the p-channel MOS transistor 132. Furthermore, the current mirror circuits are formed by the n-channel MOS transistors 133 and 134. Thus, an electric current in a quantity equal to that of an electric current flowing through the n-channel MOS transistor 133 flows through the n-channel MOS transistor 134. The electric current from the n-channel MOS transistor 134 and the electric current from the p-channel MOS transistor 135 flow into the node C.

Therefore, in case a large quantity of the electric current is supplied to the drains of the memory cells 1 to 3 by the first charge pump circuit 25, the voltage of the node C is lowered. On the contrary, a small quantity of the electric current is supplied to the drains of the memory cells 1 to 3 by the first charge pump circuit 25, the voltage of the node C is raised.

In this embodiment, since the current peak required for data write can be lowered and the generation efficiency of hot electrons can be increased, write time can be shortened.

(Fourth Embodiment)

Figure 8:
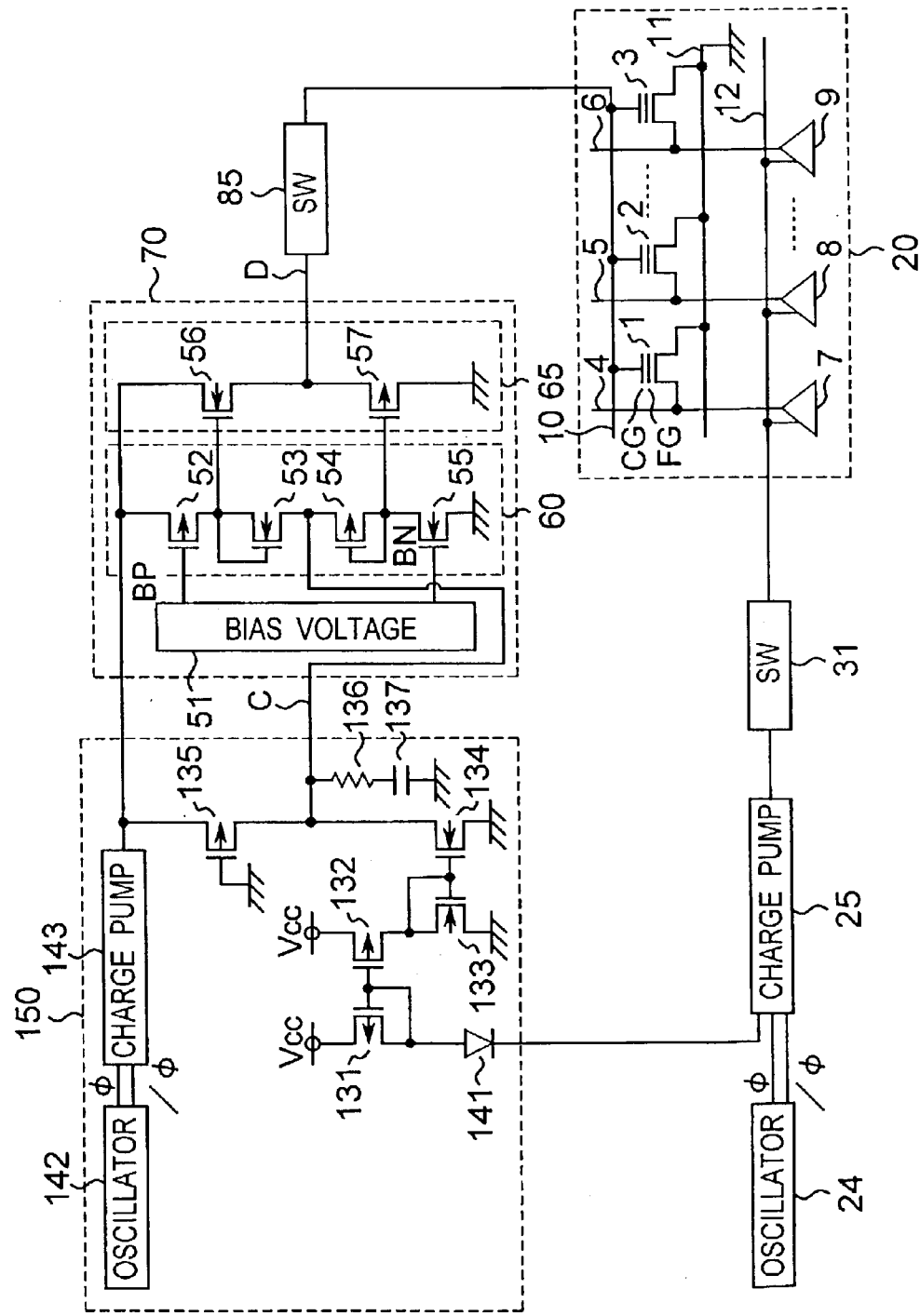
FIG. 8 is a circuit diagram of a a nonvolatile semiconductor memory according to a fourth embodiment of the present invention.

FIG. 8 is a circuit diagram of a nonvolatile semiconductor memory according to a fourth embodiment of the present invention. This nonvolatile semiconductor memory includes a conversion circuit 150 which is similar to the conversion circuit 140 in the third embodiment of FIG. 7. Hence, in this nonvolatile semiconductor memory, a combination of the conversion circuit 150 and the amplifier circuit 70 acts as a combination of the detection circuit 30 and the voltage control circuit 80 of the nonvolatile semiconductor memory of FIG. 1.

In addition to the electrical components 131 to 137 of the conversion circuit 140 in FIG. 7, the conversion circuit 150 includes a diode 141 inserted between the first charge pump circuit 25 and the p-channel MOS transistor 131, a second oscillator 142 and a second charge pump circuit 143 connected to the second oscillator 142, the p-channel MOS transistor 135 and the amplifier circuit 70. Since other configurations of the nonvolatile semiconductor memory are similar to those of the nonvolatile semiconductor memory of the third embodiment of FIG. 7, the description is abbreviated for the sake of brevity.

In the third embodiment, the control gate voltage supplied to the control gates CG of the memory cells 1 to 3 is inputted to the p-channel MOS transistor 135 from a power source of the high voltage Vpp, which is disposed outside a nonvolatile semiconductor memory chip. On the other hand, in this embodiment, the second charge pump circuit 143 generates a high voltage in response to clock pulses φ and /φ) outputted from the second oscillator 142 and supplies the high voltage to the control gates CG of the memory cells 1 to 3 via the second switching circuit 85. As a result, such an advantage is gained that the number of voltages supplied to the nonvolatile semiconductor memory chip from outside can be reduced to one. The above described configuration in which an internal circuit composed of the second oscillator 142 and the second charge pump circuit 143 is employed in place of the power source of the high voltage Vpp can be applied also to the first and second embodiments.

In this embodiment, since the current peak required for data write can be lowered and the generation efficiency of hot electrons can be increased, write time can be shortened.

(Fifth Embodiment)

Figure 9:
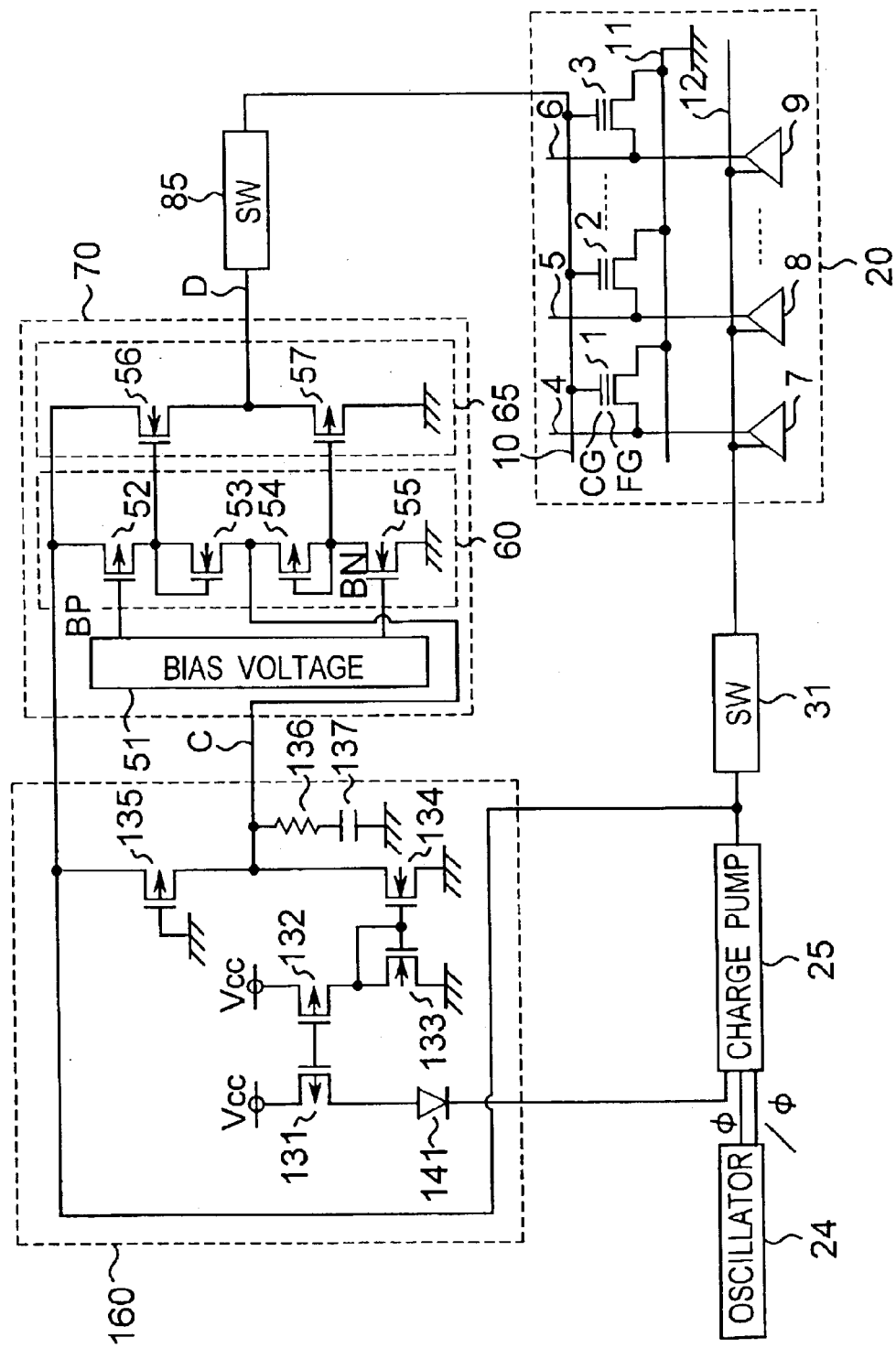
FIG. 9 is a circuit diagram of a a nonvolatile semiconductor memory according to a fifth embodiment of the present invention.
Figure 10:
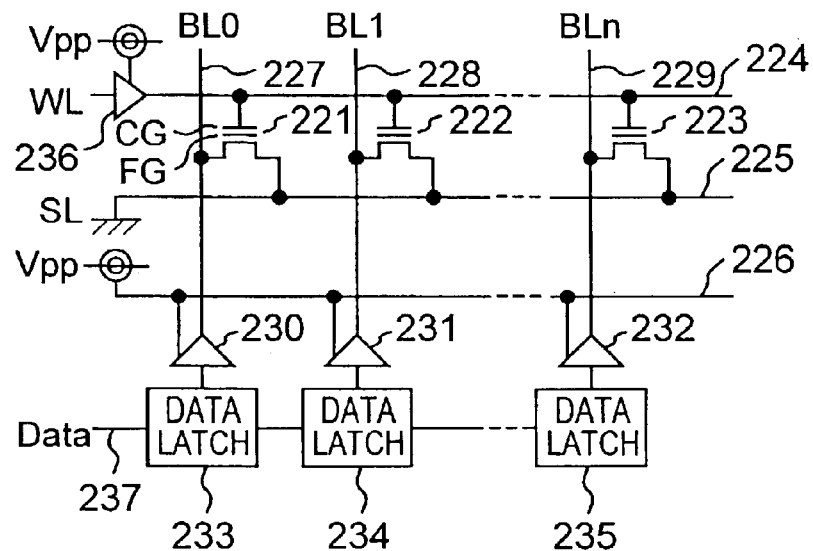
FIG. 10 is a circuit diagram showing memory cells and a peripheral circuit of the memory cells in a conventional EEPROM.
Figure 11:
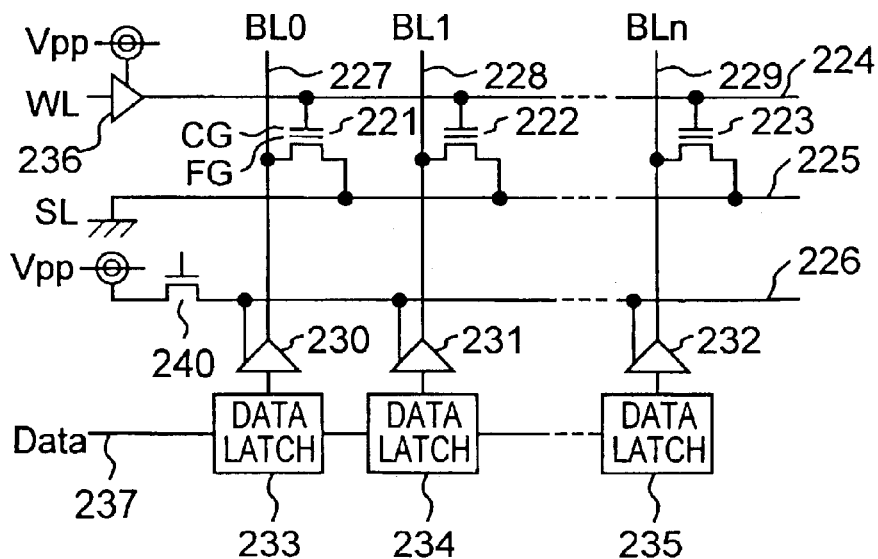
FIG. 11 is a circuit diagram showing memory cells and a peripheral circuit of the memory cells in another conventional EEPROM.

FIG. 9 is a circuit diagram of a nonvolatile semiconductor memory according to a fifth embodiment of the present invention. This nonvolatile semiconductor memory includes a conversion circuit 160 which is similar to the conversion circuit 140 in the third embodiment of FIG. 7. Thus, in this embodiment, a combination of the conversion circuit 160 and the amplifier circuit 70 acts as a combination of the detection circuit 30 and the voltage control circuit 80 of the nonvolatile semiconductor memory of FIG. 1.

In addition to the electrical components 131 to 137 of the conversion circuit 140 in FIG. 7, the conversion circuit 160 includes the diode 141 inserted between the first charge pump circuit 25 and the p-channel MOS transistor 131. In this nonvolatile semiconductor memory, the second oscillator 142 and the second charge pump circuit 143 of the conversion circuit 150 of the fourth embodiment of FIG. 8 are eliminated and a junction of the first charge pump circuit 25 and the first switching circuit 31 is connected to the p-channel MOS transistor 135 of the conversion circuit 160 and the amplifier circuit 70. Since other configurations of the nonvolatile semiconductor memory are similar to those of the nonvolatile semiconductor memory of the third embodiment of FIG. 7, the description is abbreviated for the sake of brevity.

In this nonvolatile semiconductor memory, since the first charge pump circuit 25 and the second charge pump circuit 143 of the nonvolatile semiconductor memory of the fourth embodiment of FIG. 8 are replaced by the single first charge pump circuit 25, a chip area of the nonvolatile semiconductor memory can be reduced more than that of the nonvolatile semiconductor memory of the fourth embodiment of FIG. 8.

The above described configuration in which the control gate voltage and the drain current are supplied by the single first charge pump circuit 25 can be applied also to the first and second embodiments.

In this embodiment, since the current peak required for data write can be lowered and the generation efficiency of hot electrons can be increased, write time can be shortened.

As is clear from the foregoing description, since the nonvolatile semiconductor memory of the present invention is provided with a plurality of the memory elements each having the control gate and the floating gate such that data is stored by electron injection to the floating gate and electron emission from the floating gate and includes the electric current detecting circuit for detecting the drain current supplied to the drain of each of the memory elements and the voltage control circuit for controlling, in accordance with the drain current detected by the electric current detecting circuit, the control gate voltage supplied to the control gate of each of the memory elements, the current peak required for data write can be lowered and the generation efficiency of hot electrons can be increased, so that such a marked effect is gained that write time can be shortened.

Meanwhile, in the nonvolatile semiconductor memory according to the first embodiment of the present invention, since the detection signal of the electric current detecting circuit is binary, increase and decrease of values of the detection signal can be controlled by increasing one value and reducing the other value of the detection signal.

Furthermore, in the nonvolatile semiconductor memory according to the second embodiment of the present invention, since the detection signal of the electric current detecting circuit is ternary or more, one value of the detection signal can be used without being increased or reduced, so that it is possible to restrain oscillation due to increase or decrease of values of the detection signal.

What is claimed is:

1. A nonvolatile semiconductor memory which is provided with a plurality of memory elements each having a control gate and a floating gate such that data is stored by electron injection to the floating gate and electron emission from the floating gate, comprising:

an electric current detecting circuit configured for detecting a drain current supplied to a drain of each of the memory elements; and a voltage control circuit configured for controlling, in accordance with the drain current detected by the electric current detecting circuit, a control gate voltage supplied to the control gate of each of the memory elements, wherein the voltage control circuit includes a reference potential generating circuit configured for generating a first internal potential in response to an output of the electric current detecting circuit and an amplifier circuit for outputting, via a second internal potential, a third internal potential to an output node of the voltage control circuit in accordance with the first internal potential in response to a first supply potential;

wherein the amplifier circuit includes a reference potential input portion configured for outputting the second internal potential in response to the first internal potential and a drive portion configured for driving the third internal potential of the output node in response to the second internal potential;

wherein the reference potential input portion includes a first field effect transistor in which a source is connected to the first internal potential and a drain and a gate are connected to the second internal potential and a first current source which is provided between a first internal node subjected to a predetermined supply potential and the first field effect transistor so as to supply a first bias current to the first field effect transistor; and wherein the drive portion includes a second field effect transistor in which a gate is connected to the gate of the first field effect transistor and which is provided on a path connecting a second internal node subjected to the predetermined supply potential and the output node.

2. The nonvolatile semiconductor memory according to claim 1, wherein the electric current detecting circuit detects a signal obtained by converting the drain current into a voltage and the signal of the electric current detecting circuit is binary.

3. The nonvolatile semiconductor memory according to claim 1, wherein the electric current detecting circuit detects a signal obtained by converting the drain current into a voltage and the signal of the electric current detecting circuit is ternary or more.

4. A nonvolatile semiconductor memory which is provided with a plurality of memory elements each having a control gate and a floating gate such that data is stored by electron injection to the floating gate and electron emission from the floating gate, comprising:

an electric current detecting circuit configured for detecting a drain current supplied to a drain of each of the memory elements, and a voltage control circuit configured for controlling, in accordance with the drain current detected by the electric current detecting circuit, a control gate voltage supplied to the control gate of each of the memory elements, wherein the electric current detecting circuit includes a conversion circuit configured for converting the drain current into a first internal potential so as to output the first internal potential to the voltage control circuit;

wherein the voltage control circuit includes an amplifier circuit for outputting, via a second internal potential, a third internal potential to an output node of the voltage control circuit in accordance with the first internal potential in response to a first supply potential;

wherein the amplifier circuit includes a reference potential input portion configured for outputting the second internal potential in response to the first internal potential and a drive portion configured for driving the third internal potential of the output node in response to the second internal potential;

wherein the reference potential input portion includes a first field effect transistor in which a source is connected to the first internal potential and a drain and a gate are connected to the second internal potential and a first current source which is provided between a first internal node subjected to a predetermined supply potential and the first field effect transistor so as to supply a first bias current to the first field effect transistor; and wherein the drive portion includes a second field effect transistor in which a gate is connected to the gate of the first field effect transistor and which is provided on a path connecting a second internal node subjected to the predetermined supply potential and the output node.

5. The nonvolatile semiconductor memory according to claim 4, wherein the conversion circuit includes current mirror circuits.

6. The nonvolatile semiconductor memory according to claim 1, wherein the first and second internal nodes are connected to the first supply potential;

wherein the reference potential input portion further includes a third field effect transistor in which a source is connected to the first internal potential and a drain and a gate are connected to a fourth internal potential and a second current source which is provided between a grounded node and the third field effect transistor so as to supply a second bias current to the third field effect transistor;

wherein the drive portion further includes a fourth field effect transistor in which a gate is connected to the gate of the third field effect transistor and which is provided on a path connecting the grounded node and the output node.

7. The nonvolatile semiconductor memory according to claim 6, wherein each of the first and second field effect transistors is an n-channel MOS transistor, while each of the third and fourth field effect transistors is a p-channel MOS transistor.

8. The nonvolatile semiconductor memory according to claim 1, wherein the first and second internal nodes are connected to the first supply potential;

wherein the reference potential input portion further includes a second current source configured for causing the first bias current to flow from the source of the first field effect transistor towards a grounded node;

wherein the drive portion further includes a third current source configured for causing a second bias current to flow from the output node towards the grounded node.

9. The nonvolatile semiconductor memory according to claim 8, wherein each of the first and second field effect transistors is an n-channel MOS transistor.

10. The nonvolatile semiconductor memory according to claim 1, wherein the first and second internal nodes are connected to a grounded node;

wherein the reference potential input portion further includes a second current source configured for causing the first bias current to flow towards the source of the first field effect transistor from a node subjected to the first supply potential;

wherein the drive portion further includes a third current source configured for causing a second bias current to flow towards the output node from a node subjected to the first supply potential.

11. The nonvolatile semiconductor memory according to claim 10, wherein each of the first and second field effect transistors is a p-channel MOS transistor.

12. The nonvolatile semiconductor memory according to claim 1, wherein the drive portion further includes a current limiter configured for restricting to a predetermined value an electric current flowing through the second field effect transistor;

wherein the current limiter is connected to the second field effect transistor in series on a path connecting the second internal node and the output node.

13. The nonvolatile semiconductor memory according to claim 1, wherein the drive portion further includes a fifth field effect transistor which is connected to the second field effect transistor in series on a path connecting the second internal node and the output node and has a diode connection.

14. The nonvolatile semiconductor memory according to claim 1, wherein the reference potential generating circuit includes a voltage divider for performing voltage division between the first supply potential and a ground potential so as to apply a plurality of outputs to a plurality of voltage division nodes, respectively and a selector circuit configured for selecting and outputting, in response to the outputs of the voltage divider, a potential of one of the voltage division nodes in accordance with the output of the electric current detecting circuit.

15. The nonvolatile semiconductor memory according to claim 1, wherein the reference potential generating circuit includes a sixth field effect transistor connected between the first supply potential and an output of the reference potential generating circuit and a seventh field effect transistor connected between a ground potential and the output of the reference potential generating circuit and controls gate voltages of the sixth and seventh field effect transistors in accordance with the output of the electric current detecting circuit.

16. The nonvolatile semiconductor memory according to claim 1, wherein the reference potential generating circuit includes a first supply means for supplying electric current to an output of the reference potential generating circuit and a second supply means for supplying the output of the electric current detecting circuit to the output of the reference potential generating circuit;

wherein the first supply means is connected between the first supply potential and the output of the reference potential generating circuit.

17. The nonvolatile semiconductor memory according to claim 1, wherein the first supply potential is generated by an internal circuit.

18. The nonvolatile semiconductor memory according to claim 1, wherein the first supply potential is generated by a circuit for supplying the drain current to the drain of each of the memory elements.

* * * * *